United States Patent [19]
Hecker et al.
[11] 3,745,374
[45] July 10, 1973

[54] LOGARITHMIC AMPLIFIER AND LIMITER

[75] Inventors: Joel Hecker; Robert Zinke, both of Brooklyn, N.Y.

[73] Assignee: The United States of America as represented by the Secretary of the Navy, Washington, D.C.

[22] Filed: Jan. 26, 1972

[21] Appl. No.: 220,985

[52] U.S. Cl. .................. 307/230, 307/237, 328/145
[51] Int. Cl. .......................... G06g 7/12, G06g 7/24
[58] Field of Search .................... 307/229, 230, 237; 328/145

[56] References Cited

UNITED STATES PATENTS

| | | | |
|---|---|---|---|
| 3,234,404 | 2/1966 | Peters | 328/145 X |
| 3,403,347 | 9/1968 | Stull, Jr. | 328/145 X |
| 3,417,263 | 12/1968 | Thomas | 328/145 X |
| 3,435,353 | 3/1969 | Sauber | 328/145 |
| 3,445,681 | 5/1969 | Cattermole et al. | 307/229 |
| 3,662,274 | 5/1972 | Pritchard et al. | 328/145 X |
| 3,678,294 | 7/1972 | Glathe | 307/230 |

*Primary Examiner*—Stanley D. Miller, Jr.
*Attorney*—R. S. Sciascia and Thomas O. Watson

[57] ABSTRACT

A solid state logarithmic amplifier and limiter device using seven logarithmic stages to achieve a 70 db logarithmic range. Without the use of vacuum tubes or diodes, the input voltage is attenuated and amplified in separate channels to produce seven logarithmic currents which are summed to produce the log amplified and limited output.

5 Claims, 3 Drawing Figures

LOGARITHMIC AMPLIFIER AND LIMITER

BACKGROUND OF THE INVENTION

A. Field of the invention

The present invention relates generally to a logarithmic solid state amplifier and limiter and more particularly to a logarithmic solid state amplifier operating at 1.1 MHz in which the output signal is in proportion to the logarithmic of the input signal and to a limited output over a desired input range.

One of the main problems in the prior art is that conventional or other practical log amplifiers cannot handle high level signal inputs. Simple attenuation to the optimum level would degrade the noise figure to an unacceptable level. The present invention solves this problem and provides a log amplifier that has the capability of operating at high input signal levels while maintaining the low noise level required under small signal conditions.

B. Description of the prior art

To derive a logarithmic characteristic, the prior art has used such techniques as automatic gain control, operation upon a non-linear portion of an amplifying device, and by employing successive saturation of a plurality of cascaded amplifier stages. Devices used in the successive amplification stages have generally been vacuum tubes or diodes. Those systems using transistors to achieve logarithmic amplification have had to use transformers to buffer the cascaded stages.

The intermediate frequency logarithmic amplifiers of the prior art have several disadvantages. The diode breakdown technique, for example, has high power requirements, depends upon the matching of unmatched transistors, has many parts per stage, does not lend itself to hybrid fabrication, and requires a potentiometer to adjust the bias current. In addition to these shortcomings, logarithmic amplifiers which are tube versions require tuning each stage by involved procedures, require frequent tuning to maintain logarithmic characteristics, and are often bulky. These amplifiers generally have poor logarithmic characteristics and large slope deviations.

SUMMARY OF THE INVENTION

The invention consists of several identical stages whose output currents are summed in parallel to provide a logarithmic output of a linearly increasing input signal. Logarithmic behavior over a wide range of input signals may be obtained by attenuating the input voltage and amplifying the input voltage in separate channels and adding their logarithmic output currents. In addition, the gain of the amplifier is such as to provide a limited output over the desired input range, which also preserves phase information.

OBJECTS OF THE INVENTION

An object of the present invention is to eliminate or reduce several of the aforementioned shortcomings.

Another object is to decrease the heat dissipated by the elimination of vacuum tubes.

A further object of the invention is to use low power devices, by operating in the low end of the transistor's $V_{be}$ region to achieve the logarithmic characteristics.

Still another object of the invention is to provide a wide variety of components to choose from, which will make the device applicable to hybrid packaging techniques as well as other compact and effective packaging methods.

Still another object of the invention is to provide a log amplifier that can operate at high input signal levels while maintaining the low noise level required under small signal conditions.

Other objects, advantages, and novel features of the present invention will become apparent from the following detailed description of the invention when considered in conjunction with the accompanying drawings.

DESCRIPTION OF THE PREFERRED EMBODIMENT

Figure 1A:
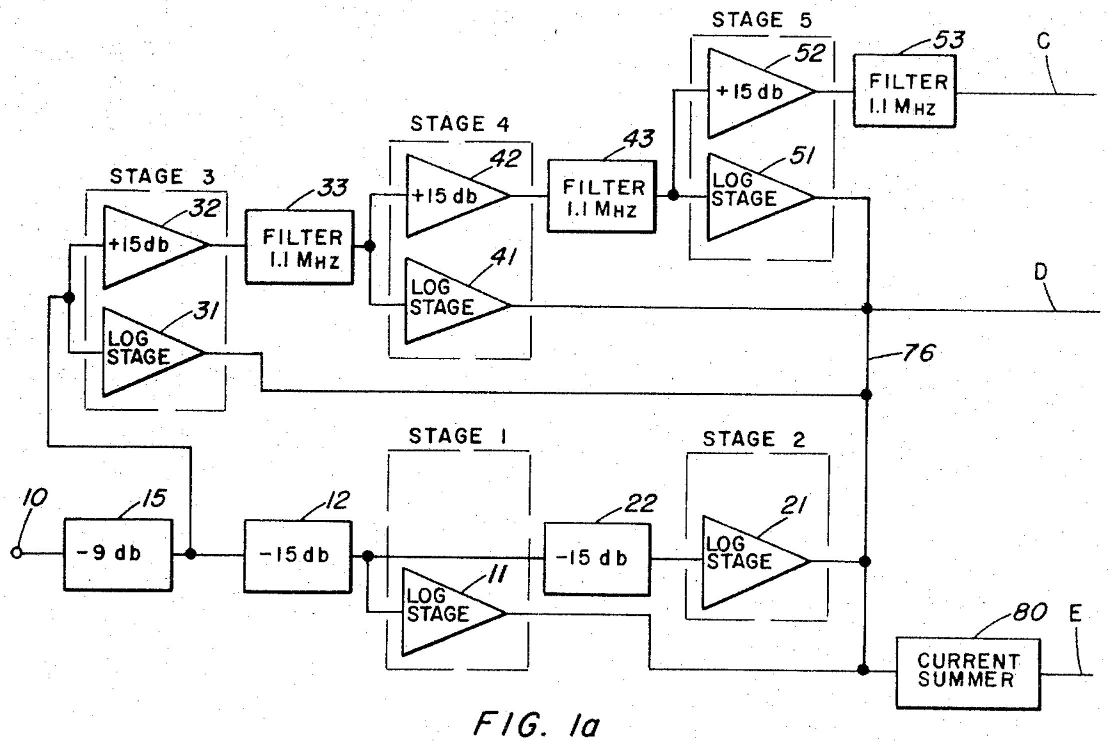
FIGS. 1*a* and *b* together show a block diagram of a preferred embodiment of the invention.

FIGS. 1*a* and *b*, which depict the preferred embodiment when joined together at C, D and E, show seven stages of logarithmic amplification. All seven stages use the four monolithic transistor circuitry of FIG. 2, which, as will be described later, is designed to yield a 15 db gain and a logarithmic output current. Stages 1 and 2 use only the logarithmic output current portion of FIG. 2, but stages 3 through 7 use both the 15 db voltage gain and the logarithmic output current portion. Referring now to the FIG. 1*a*, the device's input signal applied to input 10 is attenuated by a 9 db attenuator 15. This signal is further attenuated by a 15 db attenuator 12 and applied to only the log amplifier 11 of stage 1. 15 db attenuator 22 further attenuates the input signal and applies it only to the log amplifier 21 of stage 2. The 9 db attenuator 15 and the two stages of 15 db attenuation 12 and 22 permit the amplifier to be used with signal levels too high for conventional amplifiers while maintaining low noise levels. This is accomplished by using some 15 db gain stages 3, 4, 5, 6 and 7 and two attenuation stages 12 and 22 whose 15 db attenuation is scaled to be inverse of the 15 db gain stages. The 9 db attenuation stage is used to attenuate the input signal to the optimum signal level to the log stages to insure the proper log characteristics without degrading the noise figure beyond allowable levels. As will be seen later, the logarithmic output current of each stage is applied at a common point 76.

The output of attenuator 15 is also applied to stage 3. The input signal to stage 3 is applied to the log amplifier 31 and to a 15 db gain amplifier 32. The output of amplifier 32 is applied to a 1.1 MHz filter 33. As in stage 3, input signals to stages 4, 5, 6 and 7 are applied simultaneously to log stages 41, 51, 61 and 71, and to 15 db amplifiers 42, 52, 62, 72. Also, the outputs from said amplifiers are fed into filters 43, 53, 63, 73, respectively. The voltage inputs to stages 3 through 7 are amplified and filtered and applied to the succeeding stage. Also the input voltages to stages 3 through 7 produce output logarithmic currents which are also connected to common point 76.

The output of stage 7 and its respective filter 73 is applied to differential amplifier 74 which produces a limited IF signal at output 75. The gain from input 10 to the input of differential amplifier 74 is 66 db. This causes differential amplifier 74 to square the device's input signal, thereby yielding a 1 volt peak to peak limited IF output at output 75. With proper selection of frequency break points, this output may be used to maintain phase information.

The seven logarithmic current outputs connected to common point 76 are added in the current summer 80, applied through a 1.1 MHz filter 82, amplified in amplifier 84, and pass through emitter follower 86 to a peak detector and filter 88. The signal is then fed through emitter follower 90 to produce a modulator signal at output 92. Also, the signal output of peak detector and filter 88 is applied to a filter and attenuator 94 whose output is fed into differential amplifier 96. Thus, the seven current outputs of the logarithmic amplifiers are added, filtered, and amplified by approximately 20 db. The peak to peak output therefore are logarithmic function of the input signal.

It should be noted that variable resistor 95 adjusts the DC gain of filter-attenuator 94, and variable resistor 97 adjusts the DC offset voltage of amplifier 96. The DC output appearing at output 98 is a 1.1 MHz limited logarithmic value of the input.

Figure 2:
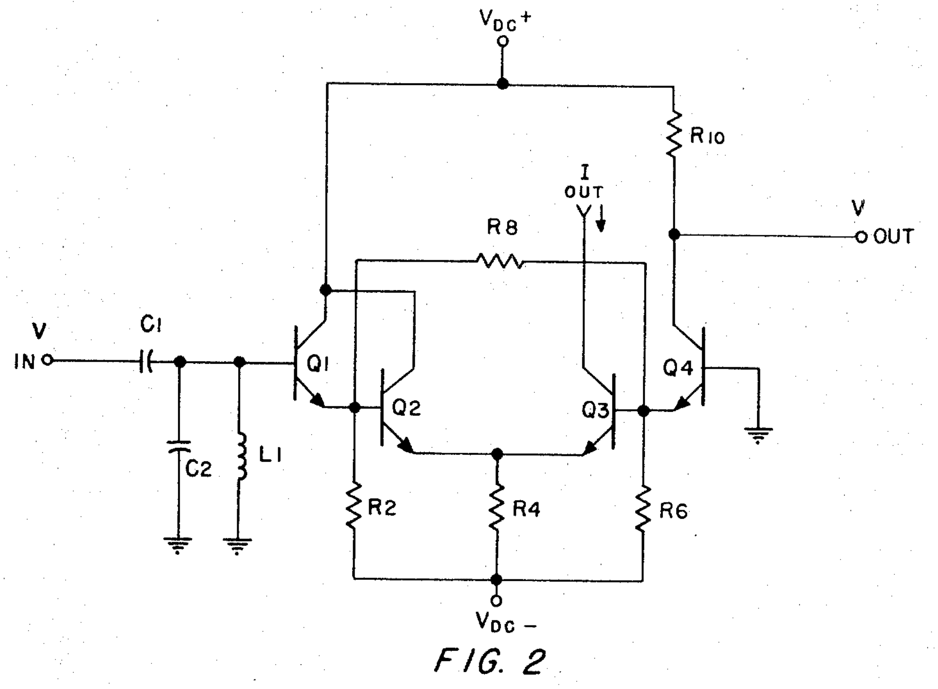
FIG. 2 depicts a schematic drawing of a logarithmic and amplification stage used in FIG. 1.
Figure 1B:
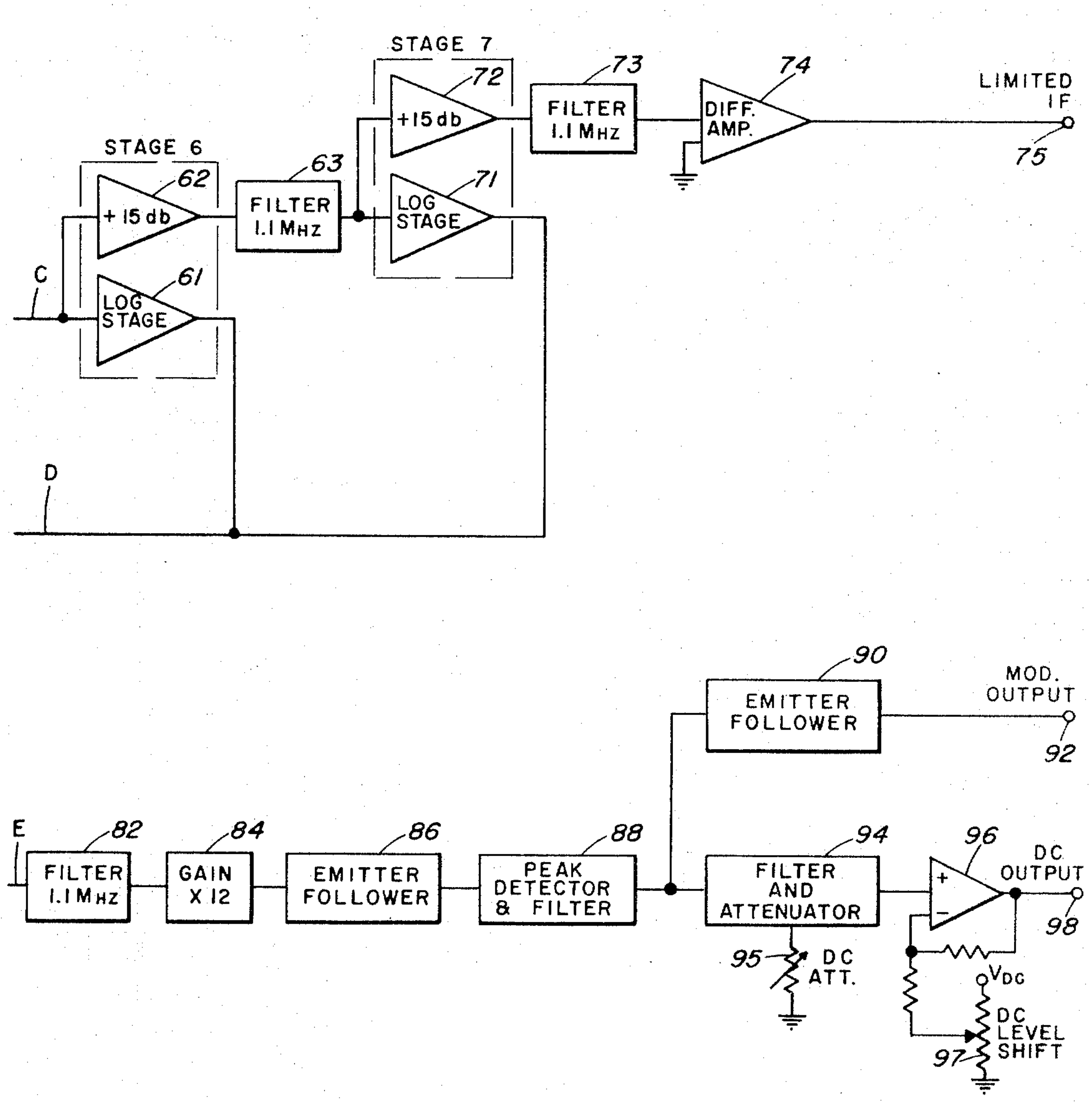

As stated previously, the four transistor configuration of FIG. 2 is used to makeup the seven stages of FIG. 1. All four transistors are used in stages 3 through 7 to give a 15 db voltage amplification and the log current output, but only transistors Q2 and Q3 are used in stages 1 and 2 to provide only the log current output. The input signal $V_{in}$ is applied through the capacitor C1 and filter comprising capacitor C2 and inductor L1 to the base of transistor Q1. Transistor pair Q2 and Q3 yield the logarithmic characteristic in which the current into the collector of transistor Q3 is logarithmically related to the voltage $V_{in}$ from 17 millivolts to 64 millivolts. The gain of 15 db is obtained from transistors Q1 and Q4 and resistors R8 and R10.

Thus the circuit of FIG. 2 takes the input voltage $V_{in}$ and produces an output voltage $V_{out}$ amplified by 15 db gain and also produces a current $I_{out}$ which is logarithmically related to the input voltage $V_{in}$. To use the embodiment of FIG. 2 to achieve only the logarithmic amplification of stages 1 and 2, only transistors Q2 and Q3 with associated resistors R2, R4 and R6 are used. Attenuation as required by attenuators 12 and 22 of FIG. 1 is achieved by the use of resistive voltage dividers on the input to the transistors pair Q2, Q3.

The schematic of FIG. 2 uses microcircuits which contain four monolithic transistors. These four transistors constitute one stage of logarithmic action needed in FIG. 1 and are used obtain both serial voltage gain and parallel current summation. The number of stages used to achieve logarithmic amplification and limiting depends on the logarithmic range desired. In the amplifier of FIG. 1 approximately 70 db of logarithmic range is achieved with a maximum log slope error of 1.176 db at 25° C. The interstage coupler is a low Q, LC circuit and requires no initial adjustment or tuning.

Hybrid techniques enable packing each stage in a chip form, thereby, reducing the physical dimensions. Also, a reduction in the electrical problems associated with mechanical size is achieved. Since summation techniques are used, low power consumption in the log stages results. Thus, logarithmic behavior over a wide range of value has been obtained by the combination of signal attenuation, and amplification in separate channels.

The problems of the prior art have been solved using the present configuration to achieve 1.1 MHz logarithmic amplifier and limiter. The present system does not use vacuum tubes nor diodes and thus alleviates the heat dissipation problems and the high power requirements. Also the present system is compact and requires no extensive tuning of elements to produce the desired results. As indicated previously, any number of stages may be used once the range desired is selected.

Obviously many modifications and variations of the present invention are possible in light of the above teachings. It is therefore to be understood that, within the scope of the appended claims, the invention may be practiced otherwise than as specifically described herein.

What is claimed is:

1. A logarithmic amplifier and limiter device for providing an output signal representative of the logarithm of an input signal comprising:

a plurality of amplifier stages, each stage including a voltage amplifier and a logarithmic current amplifier, both amplifiers in each stage being connected to a common input;

means for connecting the output of each voltage amplifier to the input of another voltage amplifier, whereby said voltage amplifiers are connected in cascade;

a plurality of attenuators connected in cascade;

means for connecting said input signal to the inputs of the first of said cascaded voltage amplifiers and the first of said cascaded attenuators;

a plurality of logarithmic current amplifiers, the number being the same as the number of attenuators, each one connected to the output of one said attenuators; and, a first output means connected to the outputs of all of said logarithmic current amplifiers including those in said amplifier stages, for summing the logarithmic currents and generating at its output a logarithmic representation of the device's input signal.

2. A logarithmic amplifier and limiter device as in claim 1 wherein:

said first output means also provides a modulated output signal; and a second output means is connected to the output of the last cascaded voltage amplifier for providing a voltage limited output.

3. A logarithmic amplifier and limiter device as in claim 2 wherein:

said voltage amplifier connecting means includes a plurality of filters connected one to each voltage amplifier output; and said second output means comprises a differential amplifier whose input is connected to the last of said filters and which produces a limited IF signal.

4. A logarithmic amplifier and limiter device of claim 2 wherein said first output means includes:

a peak detector and first filter;

an emitter follower connected to said peak detector and first filter for providing said modulated output signal;

an attenuator and second filter connected to said peak detector and first filter; and an operational amplifier connected to said attenuator and second filter for providing said logarithmic output.

5. A logarithmic amplifier and limiter device of claim 4 wherein:

the attenuator of said attenuator and second filter is manually adjustable; and said operational amplifier has a manually adjustable D.C. offset.

* * * * *